United States Patent [19]

Dayani

[11] Patent Number: 5,303,395
[45] Date of Patent: Apr. 12, 1994

[54] POWER CONTROL WITH A CONSTANT GAIN AMPLIFIER FOR PORTABLE RADIO TRANSCEIVERS

[75] Inventor: Oscar Dayani, Atlanta, Ga.

[73] Assignee: Mitsubishi Consumer Electronics America, Inc., Braselton, Ga.

[21] Appl. No.: 788,477

[22] Filed: Nov. 6, 1991

[51] Int. Cl.$^5$ .............................................. H04B 1/40
[52] U.S. Cl. ....................................... 455/127; 455/89
[58] Field of Search ............... 455/127, 89, 90, 343, 455/128, 115; 330/127, 136, 138, 279

[56] References Cited

U.S. PATENT DOCUMENTS

| | | | |
|---|---|---|---|
| 4,636,741 | 1/1987 | Mitzlaff | 455/127 |
| 4,680,787 | 7/1987 | Marry | 379/63 |
| 5,033,109 | 7/1991 | Kawano et al. | 455/127 |
| 5,146,614 | 9/1992 | Furuno | 455/127 |

Primary Examiner—Reinhard J. Eisenzopf
Assistant Examiner—Nguyen Vo
Attorney, Agent, or Firm—Leydig, Voit & Mayer, Ltd.

[57] ABSTRACT

A system for controlling the power level of RF signals output by a portable radio transmitter having a first voltage supply, a first amplifier stage and a microcomputer coupled to the first amplifier stage for selecting one of a set of power levels. An indicator signals when the radio transmitter is coupled to a vehicular voltage supply and, in response, the microcomputer generates a control signal representative of a desired power level. A second amplifier stage is coupled to the first amplifier stage and receives RF signals at the selected power level. A constant gain control circuit coupled to the second amplifier stage receives the control signal and responds by setting the gain of the second amplifier stage at one of at least two constant gain values so that the output RF signals are provided with the desired power level.

19 Claims, 4 Drawing Sheets

POWER CONTROL WITH A CONSTANT GAIN AMPLIFIER FOR PORTABLE RADIO TRANSCEIVERS

TECHNICAL FIELD

The present invention relates generally to radio transceivers and, more particularly, to a multi-level power control for use with portable radio transceivers having dual voltage supplies.

BACKGROUND ART

Vehicular operation of portable cellular telephones in remote areas is often desired, such that there is a need for higher transmit power capability in portable phones used in vehicles. Previously, power control circuitry (for generating a second set of higher output power levels) has been provided within the main body of the portable telephone. For example, in U.S. Pat. No. 4,636,741 certain of the configurations described include the capability of generating a second set of output power levels within the main unit. These configurations, however, generally result in an increase in the size and weight of the portable unit, whereas in today's cellular industry it is desirable to reduce the size and weight of portable phones.

Since a battery with a voltage higher than is typically provided by portable batteries is required to generate a second set of higher output power levels, most manufacturers now provide the power amplifying capability in a separate unit (i.e., booster) inside the vehicle so that the vehicle's battery can be utilized. This, of course, reduces the size, weight and cost of the portable phone. The microcomputer in the portable phone is used to control the output from the power booster, typically through data communication with a second microcomputer in the booster using a bi-directional serial line—see U.S. Pat. No. 4,636,741 (col. 6, lines 15-27). In such an arrangement, the second microcomputer, in response to the main unit, controls the output power of the booster by setting an eight-step attenuator or a digital to analog converter.

Alternately, the same result has been accomplished by using a data bus so that the microcomputer in the portable phone can directly control an eight-step attenuator in the power booster—see U.S. Pat. No. 4,636,741 (col. 5, line 38 to col. 6, line 14).

Although the existing designs substantially solve the problems of size and weight of portable phones, the utilization of a second microcomputer, a serial data line and/or a data bus, along with associated software for generating a second set of output power levels, makes the design/operation of the known devices complex and the cost quite high.

SUMMARY OF THE INVENTION

It is a primary object of the present invention to provide an improved power control system for a portable radio transceiver which is capable of generating different sets of output power levels in response to different supply voltages but, compared with existing units, has reduced hardware and software complexity.

Another object of the present invention is to provide a booster unit separate from a portable radio transceiver which, in conjunction with the transceiver, is capable of generating different sets of output power levels without utilizing a second microcomputer, a bi-directional serial data line or a data bus.

A further object of this invention is to provide an inexpensive power control system for a portable radio transceiver that is responsive to different supply voltages for providing different sets of output power levels.

Other objects and advantages of the invention will be apparent from the following detailed description.

In accordance with the present invention, there is provided a system for controlling the power level of RF signals output by a radio transmitter having a first voltage supply, a first amplifier stage and means coupled to the first amplifier stage for selecting one of a set of power levels, said system comprising means for indicating when the radio transmitter is coupled to a second voltage supply, means for providing a control signal when the radio transmitter is indicated to be coupled to the second voltage supply, the control signal being representative of a desired power level, a second amplifier stage coupled to the first amplifier stage which receives RF signals at the selected power level and a constant gain control circuit which is coupled to the second amplifier stage and responds to the control signal by setting the gain of the second amplifier stage so that the output RF signals are provided with the desired power level.

DESCRIPTION OF THE PREFERRED EMBODIMENTS

While the invention will be described in connection with particular preferred embodiments, it will be understood that it is not intended to limit the invention to those particular embodiments. On the contrary, it is intended to cover all alternatives, modifications and equivalents as may be included within the spirit and scope of the invention as defined by the appended claims.

Figure 1:
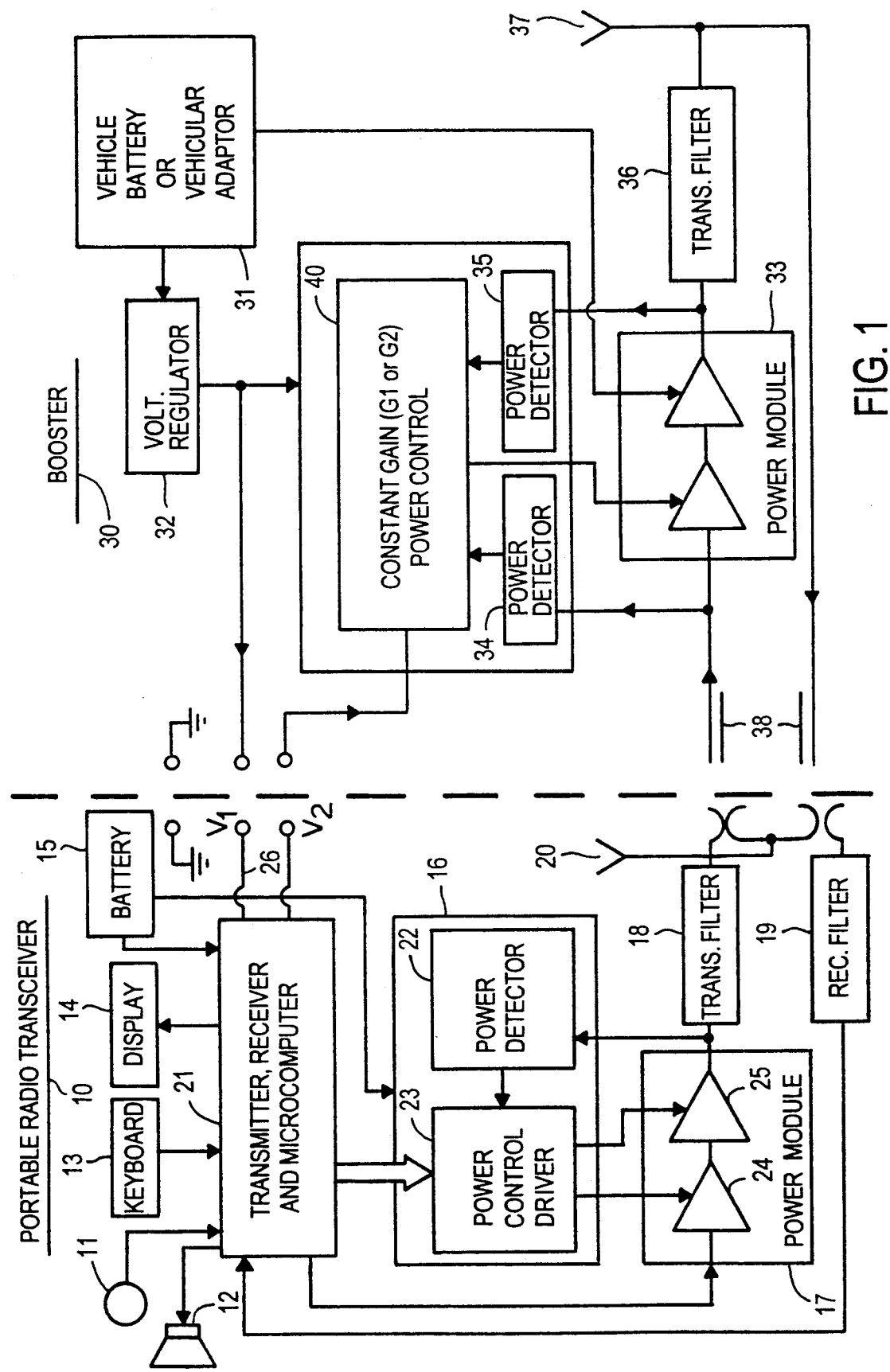
FIG. 1 is a block diagram of a portable radio transceiver together with booster circuitry embodying the present invention.

Turning now to the drawings, and referring first to FIG. 1, there is shown a portable radio transceiver 10 and a power booster 30 embodying the present invention. The portable radio transceiver 10 includes a microphone 11, speaker 12, keyboard 13, visual display 14, voltage source (i.e., battery) 15, power control 16, power amplifying module 17, transmitter filter 18, receiver filter 19, antenna 20 and transmitter, receiver and microcomputer 21. The power booster 30 includes a vehicle battery 31 (or, alternately, a vehicular adaptor for coupling to a vehicle battery), voltage regulator 32, power amplifying module 33, input power detector 34, output power detector 35, transmitter filter 36, antenna 37, transmit/receive signal jack 38, and constant gain power control 40.

With respect to the portable radio transceiver 10, the power control 16 includes a power detector 22 and a power control driver 23, which receives a control signal from the microcomputer 21 (such as a three-bit binary signal or an analog signal from an intermediate digital-to-analog converter) and a power-indicative signal from the power detector 22. As is known in the art, the value of the control signal provided by the microcomputer 21 is determined by signals indicative of desired output power that the microcomputer receives from a remote base station. Generally, the power control driver 23 uses the control signal to select one of six different power levels ($P_2$–$P_7$) of the power amplifying module 17.

The power module 17 includes at least two cascaded amplifier stages 24, 25, and may be arranged as illustrated in FIGS. 1, 3, 4 or 5 of U.S. Pat. No. 4,636,741 (incorporated herein by reference thereto). It will be readily appreciated that the power detector 22, power control driver 23, power module 17, transmit and receive filters 18, 19, antenna 20 and microcomputer 21 (along with related components 11–14) may be implemented with well-known commercially available devices, such as described or referred to in U.S. Pat. No. 4,636,741.

In operation, the microcomputer 21 in the transceiver 10 periodically monitors whether a voltage $V_1$ is applied to its input terminal 26. If the transceiver (i.e., cellular phone) is being used in a stand-alone (portable) mode, the input terminal 26 is uncoupled and no voltage is applied thereto. In that situation, the microcomputer 21 causes the transceiver 10 to transmit in a Class 3 (portable) mode of operation having six different possible power levels (levels $P_2$–$P_7$). On the other hand, when the transceiver 10 is connected to the power booster 30, a voltage $V_1$ is provided by the vehicle battery 31 and the voltage regulator 32 to the input terminal 26 of the microcomputer 21, and the microcomputer responds by causing the transceiver to transmit in a Class 1 (mobile) mode of operation having eight different possible power levels ($P_0$–$P_7$).

The following table shows the output power levels of the two different classes of cellular phones according to TIA standards:

| Class 3 (portable) | | Class 1 (mobile) | |
|---|---|---|---|
| Power Level | Power (dBm) | Power Level | Power (dBm) |
| $P_0$ | 27.8 (0.6 W) | $P_0$ | 34.8 (3.0 W) |
| $P_1$ | 27.8 | $P_1$ | 30.8 |
| $P_2$ | 27.8 | $P_2$ | 26.8 |
| $P_3$ | 23.8 | $P_3$ | 22.8 |
| $P_4$ | 19.8 | $P_4$ | 18.8 |
| $P_5$ | 15.8 | $P_5$ | 14.8 |
| $P_6$ | 11.8 | $P_6$ | 10.8 |
| $P_7$ | 7.8 | $P_7$ | 6.8 |

Thus, the Class 3 mode of operation has a maximum output power—level $P_2$—of 0.6 W (27.8 dBm), with the output power decreasing by 4 dB for each of the succeeding five levels $P_3$–$P_7$. In contrast, the Class 1 mode of operation has a maximum output power—level $P_0$—of 3.0 W (34.8 dBm), with the output power decreasing by 4 dB for each of the succeeding seven levels $P_1$–$P_7$.

In accordance with an important aspect of the present invention, power level control in the Class 1 (mobile) mode of operation is achieved by employing a constant gain amplifier design. More specifically, power detectors 34, 35 measure the voltage levels established, respectively, at the input and output terminals of the power amplifying module 33 in the booster 30, and provide signals representative of the detected voltages to the power control circuit 40. The power control circuit 40 utilizes those voltage signals to maintain a selected constant gain ($G_1$ or $G_2$) for the power module 33.

It should be noted that the power module 33 in the booster—as with the power module 17 in the transceiver—includes at least two cascaded amplifier stages and may be arranged as illustrated in FIGS. 1, 3, 4 or 5 of U.S. Pat. No. 4,636,741.

The microcomputer 21 receives signals from a remote base station that are indicative of the desired output power level and provides a binary signal $V_2$ to the power control circuit 40. If, for example, either of output power levels $P_2$ or $P_1$ is needed during Class 1 (mobile) operation, the microcomputer 21 provides a "high" (binary 1) signal $V_2$ to the power control circuit 40. This selects a first constant gain $G_1$ for the booster. On the other hand, if output power levels $P_2$–$P_7$ are sufficient during Class 1 (mobile) operation, the microcomputer 21 provides a "low" (binary 0) signal $V_2$ to the power control circuit 40, which selects a second constant gain $G_2$ for the booster.

It will, of course, be readily appreciated that a converse arrangement is possible in which a "high" signal $V_2$ is used to select gain $G_2$ and a "low" signal $V_2$ is used to select gain $G_1$.

The constant value of gain $G_1$ is predetermined such that the desired output power level $P_0$(3.0 watts) or $P_1$ (1.2 watts) is achieved through amplification of the power level provided by the transceiver 10 to the power module 33. Gain $G_2$, in contrast, is predetermined to merely compensate for losses occurring in the transceiver 10 and power booster 30 so that the output power from the booster for any one of the power levels $P_2$–$P_7$ is as specified by the TIA standards.

As an example, if the microcomputer 21 receives instructions that output power level $P_2$ is sufficient for clear RF signal transmission (that is, such that a required signal-to-noise ratio can be obtained) during mobile operation of the transceiver, a "low" signal $V_2$ is provided to the power control circuit 40—thereby selecting constant gain $G_2$—and a signal is provided to the power control driver 23 so that power level $P_2$ is established by the power module 17. An RF signal having power level $P_2$ (minus losses) is supplied to the input of the power module 33 in the booster, and the constant gain $G_2$ set by the power control circuit 40 compensates for the losses that occur so that the resulting output RF signal has power level $P_2$—as specified by the TIA standards.

In the event the necessary output power level changes to $P_0$ (or $P_1$) during mobile operation, the signal $V_2$ provided by the microcomputer 21 goes "high", thereby specifying the predetermined constant gain $G_1$. At the same time, the microcomputer 21 provides a predetermined signal to the power control driver 23 to specify power level $P_n$ (or $P_{n+1}$), where n is 2, 3, 4, 5 or 6. For example, if either of output power levels $P_0$ or $P_1$ is required, the microcomputer 21 may be programmed to select, respectively, power level $P_3$ or $P_4$. In that circumstance, the value of constant gain $G_1$ is set such that the selected power level $P_3$ is amplified to level $P_0$ and the selected power level $P_4$ is amplified to level $P_1$.

Figure 2:
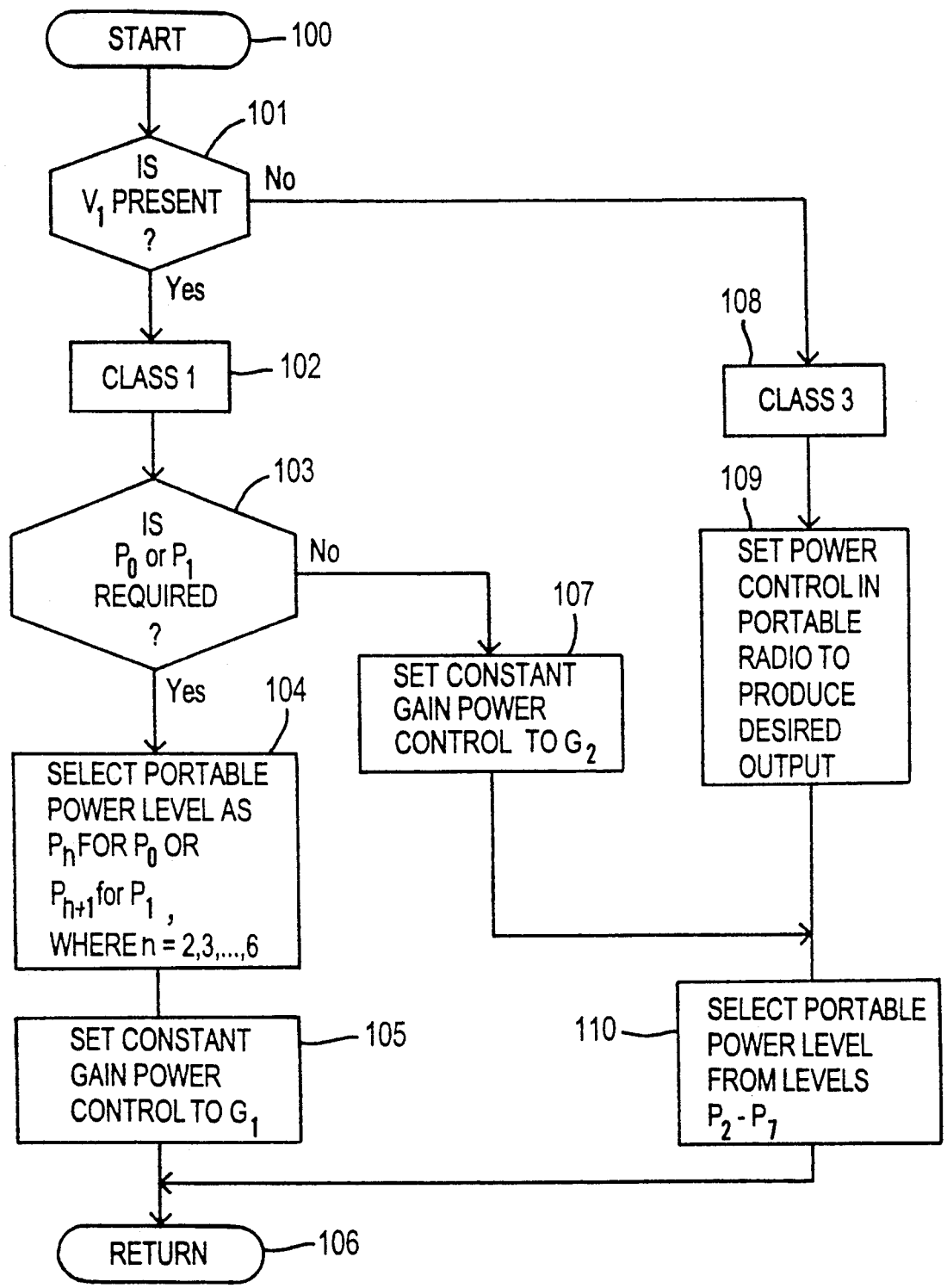
FIG. 2 is a flowchart for the process used by the portable radio transceiver in FIG. 1 for power level selection.

The foregoing operation of microcomputer 21 is illustrated in further detail by the flowchart of FIG. 2. The flowchart is entered at START block 100 when the microcomputer receives a signal from a remote base station. At block 101, the microcomputer determines whether a voltage $V_1$ is provided at its input terminal 26 (i.e., whether the booster 30 is connected to the transceiver 10). If a voltage $V_1$ is present, the microcomputer recognizes that the transceiver is in a Class 1 (mobile) mode of operation—block 101—and receives instructions whether either of output power levels $P_0$ or $P_1$ is required for clear RF signal transmission—block 103.

If either level $P_0$ or $P_1$ is required, the microcomputer (at block 104) provides a signal to the power control driver 23 to select a predetermined portable power level $P_n$ (for $P_0$) or $P_{n+1}$ (for $P_1$, where n is 2, 3, 4, 5 or 6. Thus, for example, n could be predetermined to be 3, whereby portable power level $P_3$ would be selected whenever output power level $P_0$ is needed and portable power level $P_4$ would be selected whenever output power level $P_1$ is needed.

At block 105, the microcomputer generates a "high" (binary 1) output signal $V_2$, thereby selecting a constant gain $G_1$ for the booster, and finally, at block 106, the microcomputer returns to other tasks.

If, at block 103, the microcomputer determines that one of the output power levels $P_2$-$P_7$ would be adequate for clear RF signal transmission, it generates a "low" (binary 0) output signal $V_2$ (block 107). By doing so, the microcomputer selects a constant gain $G_2$ for the booster. Next, the microcomputer selects a portable power level from among power levels $P_2$-$P_7$ (block 110) and returns to other tasks (block 106).

When a voltage $V_1$ is not provided at the input terminal 26 of the microcomputer 21, the microcomputer recognizes (at block 108) that the transceiver 10 is operating in a Class 3 (portable) mode. Accordingly, the microcomputer sets the power control 23 in the transceiver in a well-known fashion to produce the desired output power (block 109) and selects the portable power level from among power levels $P_2$-$P_7$ (block 110). The microcomputer then returns to other tasks (block 106).

Figure 3:
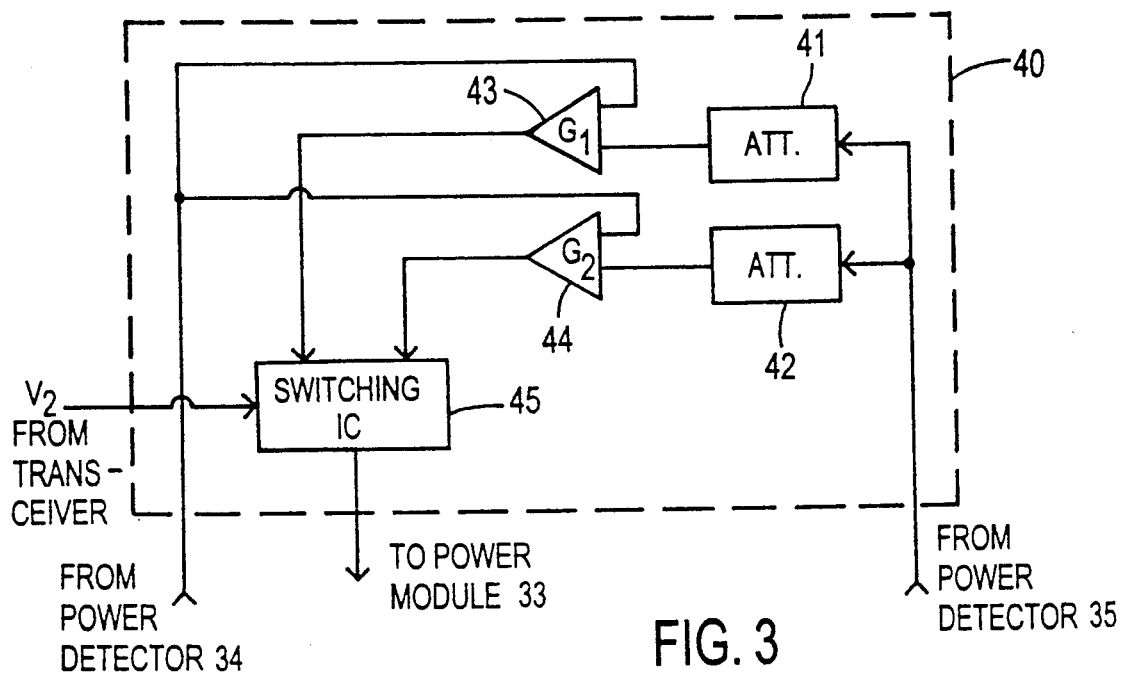
FIG. 3 is a block diagram of a first embodiment of the constant gain power control in FIG. 1.

As shown in FIG. 1, the constant gain power control circuit 40 in the booster receives signals from the microcomputer 21 and the power detectors 34, 35 and using those signals controls the gain that results across the power amplifying module 33. An embodiment of the power control circuit 40 is illustrated in FIG. 3, and includes two attentuators 41, 42, two operational amplifiers 43, 44 and a switching IC 45.

The voltage detected by the input power detector 34 is applied directly to input terminals of both operational amplifiers 43, 44 and the voltage detected by the output power detector 35 is applied through the attenuators 41, 42 to the other input terminals of both operational amplifiers. One of the operational amplifiers 43 is designed to control constant gain $G_1$ and the other operational amplifier 44 is designed to control constant gain $G_2$. The outputs of both operational amplifiers are connected to the power amplifying module 33 through a switch 45, which is controlled by the binary signal $V_2$ from the microcomputer 21 in the transceiver. In short, the switching IC 45 permits the output of only one of the operational amplifiers to be connected at any time to the control pin of the power module 33. The constant gain ($G_1$ or $G_2$) of the power module is maintained by the feedback circuit (including operational amplifiers 43, 44) utilizing the voltages detected by the input and output power detectors 34, 35.

A second possible embodiment of the power control circuit 40 (illustrated in FIG. 4) includes two operational amplifiers 51, 52, a comparator 53 and a multiplexer 54. As in the above-described embodiment of FIG. 3, the constant gain $G_2$ (needed for power levels $P_2$-$P_7$) is controlled in this second embodiment by an operational amplifier 52 which has the voltages detected by the input and output power detectors 34, 35 applied directly to its input terminals. The constant gain $G_1$ needed for power levels $P_0$ and $P_1$, however, is controlled in a somewhat different way.

More specifically, constant gain $G_1$ is controlled by an operational amplifier 51 which has the voltage detected by the output power detector 35 applied directly to its non-inverting input. One of two predetermined reference voltages ($V_a$ or $V_b$) is applied to the inverting input of the operational amplifier 51 by the multiplexer 54, whereby the operational amplifier controls the gain necessary for the generation of power levels $P_0$ and $P_1$ (3.0 watts and 1.2 watts, respectively) that are sometimes required during Class 1 mode of operation. The selection between power level $P_0$ or level $P_1$ is made by the comparator 53, which compares the voltage detected by the input power detector 34 with a predetermined reference voltage $V_{ref}$. The comparator's output changes state due to variation of the detected input voltage above or below the reference voltage $V_{ref}$, and this change of state causes the multiplexer to selectively connect either voltage $V_a$ or $V_b$ to the inverting input of the operational amplifier 51.

Figure 4:
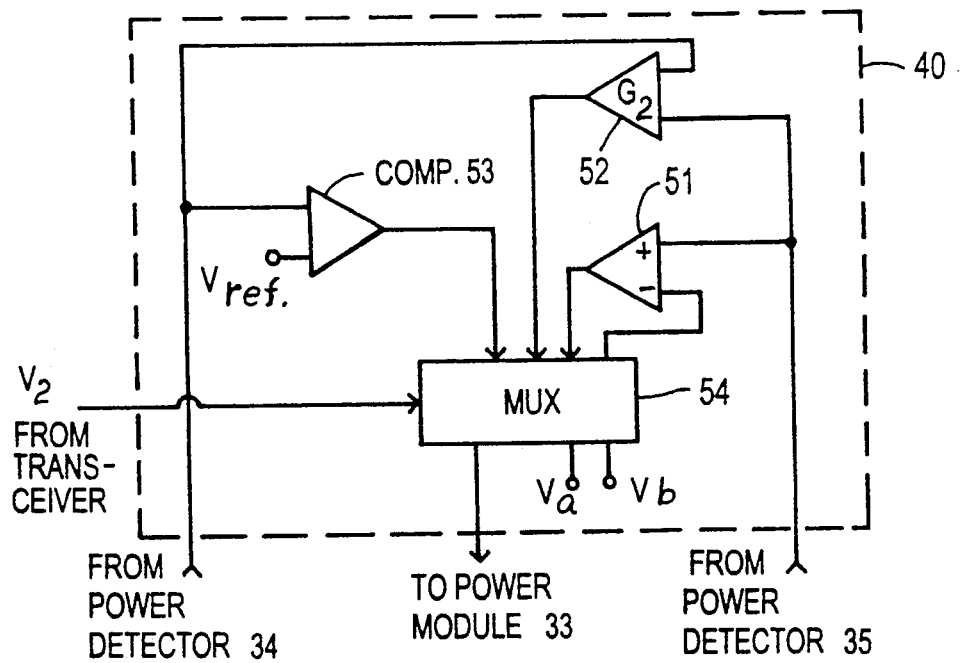
FIG. 4 is a block diagram of a second embodiment of the constant gain power control in FIG. 1.

Finally, the multiplexer 54 in the FIG. 4 embodiment connects either the output of operational amplifier 51 or the output of operational amplifier 52 to the power amplifying module 33 based on the value of the voltage $V_2$ which is provided by the microcomputer 21. As discussed previously, this determines whether constant gain $G_1$ (for power levels $P_0$ and $P_1$) or constant gain $G_2$ (for power levels $P_2$-$P_7$) is applied.

Figure 5:
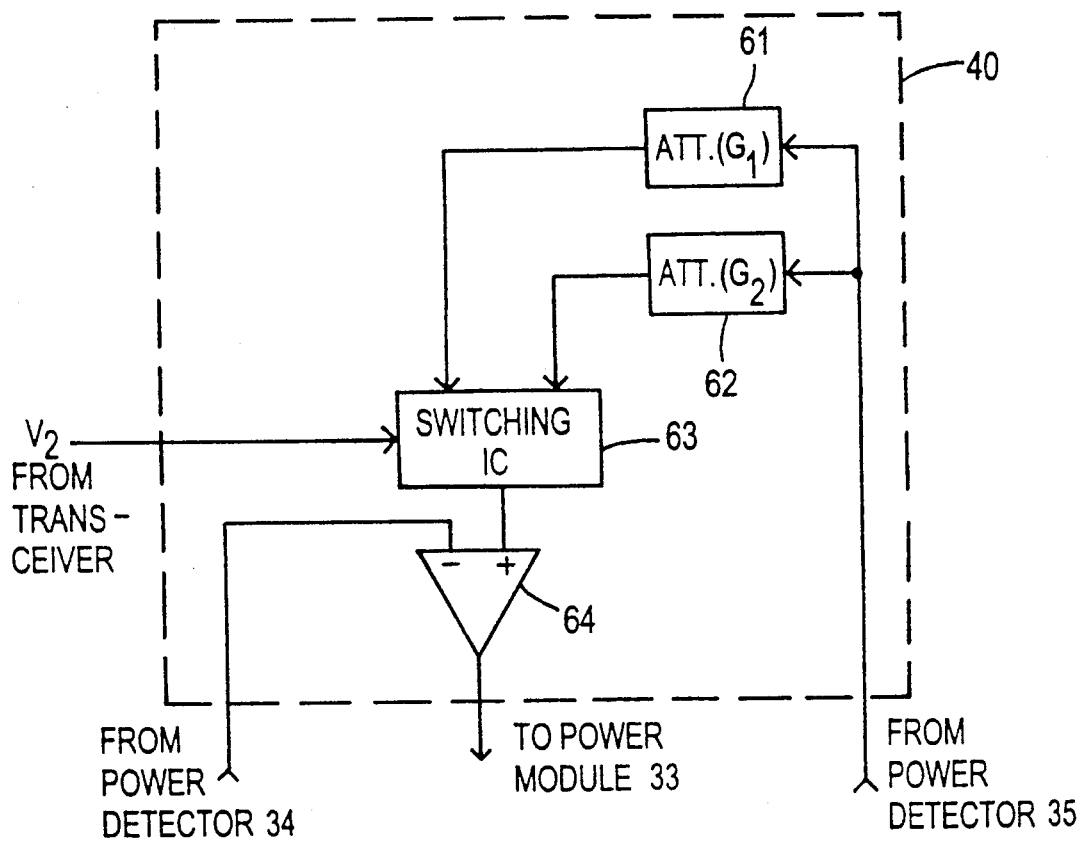
FIG. 5 is a block diagram of a third embodiment of the constant gain power control in FIG. 1.

Yet another possible embodiment of the power control circuit 40 is illustrated in FIG. 5. This embodiment includes two attenuators 61, 62, a switching IC 63 and an operational amplifier 64. The voltage detected by the output power detector 35 is applied to the inputs of both attenuators, with the attenuators being set to different levels so that through feedback to the power amplifying module 33 a predetermined constant gain of either $G_1$ or $G_2$ results. The outputs of the attenuators are supplied to the switching IC 63, which selectively couples one of the outputs to the non-inverting input of the operational amplifier 64 based on the value of the voltage $V_2$ provided by the microcomputer 21. As shown, the inverting input of the operational amplifier 64 is connected to the input power detector 34, thus providing a feedback to control and maintain a constant gain across the power module 33.

It will be readily appreciated that in the embodiment of FIG. 5 the outputs of the attenuators 61, 62 could be selectively coupled to the inverting input of the operational amplifier 64 and the signal from the input power detector 34 could be coupled to the non-inverting input of the operational amplifier without altering the operation of the control circuit 40.

As can be seen from the foregoing detailed description, this invention provides an improved power control system for a portable radio transceiver which is capable of generating different sets of output power levels in response to different supply voltages. This improved control system comprises a booster unit separate from a portable radio transceiver which facilitates the generation of different sets of output power levels without utilizing a second microcomputer, a bi-directional serial data line or a data bus. Because of the reduced hardware and software complexity of this power control system, it is generally less expensive than existing systems.

What is claimed is:

1. A system for controlling the power level of RF signals output by a radio transmitter having a first amplifier stage, means coupled to the first amplifier stage for selecting one of a selectable set of power levels and a first voltage supply which provides power to said power level selecting means, said system comprising:
   means for indicating when the radio transmitter is coupled to a second voltage supply;
   means for providing a control signal when the radio transmitter is indicated to be coupled to the second voltage supply, the control signal being representative of a desired power level;
   a second amplifier stage coupled to the first amplifier stage when the radio transmitter is coupled to the second voltage supply so as to receive RF signals at the selected power level; and
   a constant gain control circuit which is coupled to the second amplifier stage and responds to the control signal by setting the gain of the second amplifier stage at one of at least two constant gain values so that the output RF signals are provided with the desired power level, said control circuit including a first feedback circuit for setting a first constant gain value, a second feedback circuit for setting a second constant gain value and switching means responsive to the control signal for coupling one of the first and second feedback circuits to the second amplifier stage.

2. The system of claim 1, wherein a microcomputer provides both the control signal providing means and at least a portion of the power level selecting means.

3. The system of claim 1, wherein the control signal is binary, one binary state being indicative that the desired power level is among said selectable set of power levels and the other binary state being indicative that the desired power level is greater than the maximum of the power levels in said selectable set.

4. The system of claim 1, wherein the second amplifier stage comprises at least first and second cascaded amplifiers.

5. The system of claim 1, wherein the switching means comprises a multiplexer.

6. The system of claim 1, wherein each of the feedback circuits comprises an operational amplifier and at least one power detector which provides a signal to a first input of the operational amplifier.

7. The system of claim 6, wherein one of the feedback circuits further comprises a comparator and first and second voltage sources, the output of the comparator determining which of the first and second voltage sources is coupled to a second input of the operational amplifier.

8. The system of claim 1, wherein each of the feedback circuits comprises an attenuator and a power detector which provides a signal to an input of the attenuator, and wherein an operational amplifier is interposed between the switching means and the second amplifier stage.

9. A system for controlling the power level of RF signals output by a radio transmitter having a first amplifier stage, means coupled to the first amplifier stage for selecting one of a selectable set of power levels and a first voltage supply which provides power to said power level selecting means, said system comprising:
   means for indicating when the radio transmitter is coupled to a second voltage supply;
   means for providing a control signal when the radio transmitter is indicated to be coupled to the second voltage supply, the control signal being representative of a desired power level;
   a second amplifier stage coupled to the first amplifier stage when the radio transmitter is coupled to the second voltage supply so as to receive RF signals at the selected power level; and
   a constant gain control circuit which is coupled to the second amplifier stage and responds to the control signal by setting the gain of the second amplifier stage at one of two constant gain values so that the output RF signals are provided with the desired power level, the control circuit comprising a pair of power detectors and at least one operational amplifier having its output coupled to the second amplifier stage, each power detector having its output coupled to a different input of the operational amplifier, one of said power detectors measuring the power level of the RF signals at the input of the second amplifier stage and the other power detector measuring the power level of the RF signals at the output of the second amplifier stage.

10. The system of claim 1, wherein the second voltage supply is a vehicle battery.

11. A booster for adjusting the power level of RF signals output by a radio transmitter during mobile operation, the radio transmitter including a first amplifier stage, a microcomputer coupled to the first amplifier stage for selecting one of a selectable set of power levels and a first voltage supply which provides power to said microcomputer, said booster comprising:
   means for indicating to the microcomputer when the radio transmitter is coupled to a second voltage supply;
   a second amplifier stage coupled to the first amplifier stage when the radio transmitter is coupled to the second voltage supply for receiving RF signals at the selected power level; and
   a constant gain control circuit which receives a control signal representative of a desired power level from the microcomputer when the radio transmitter is indicated to be coupled to the second voltage supply, the control circuit responding to the control signal by setting the gain of the second amplifier stage at one of at least two constant gain values so that the output RF signals are provided with the desired power level, the control circuit comprising a first feedback circuit for setting a first constant gain value, a second feedback circuit for setting a second gain value and switching means responsive to the control signal for coupling one of the first and second feedback circuits to the second amplifier stage.

12. The booster of claim 11, wherein the control signal received by the control circuit is binary, one binary state being indicative that the desired power level is among said selectable set of power levels and the other binary state being indicative that the desired power level is greater than the maximum of the power levels in said selectable set.

13. The booster of claim 11, wherein the second amplifier stage comprises at least first and second cascaded amplifiers.

14. The booster of claim 11, wherein the switching means comprises a multiplexer.

15. The booster of claim 11, wherein each of the feedback circuits comprises an operational amplifier and at least one power detector which provides a signal to a first input of the operational amplifier.

16. The booster of claim 15, wherein one of the feedback circuits further comprises a comparator and first and second voltage sources, the output of the comparator determining which of the first and second voltage sources is coupled to a second input of the operational amplifier.

17. The booster of claim 11, wherein each of the feedback circuits comprises an attenuator and a power detector which provides a signal to an input of the attenuator, and wherein an operational amplifier is interposed between the switching means and the second amplifier stage.

18. The booster of claim 11, wherein the second voltage supply is a vehicle battery.

19. A booster for selectively adjusting the power level of RF signals output by a radio transmitter during mobile operation, the radio transmitter including a first amplifier stage, processing means coupled to the first amplifier stage for varying the power level of RF signals output by the radio transmitter and a first voltage supply which provides power to said processing means, said booster comprising:

means for indicating to the processing means when the radio transmitter is coupled to a second voltage supply;

a second amplifier stage coupled to the first amplifier stage when the radio transmitter is coupled to the second voltage supply for receiving the variable power RF signals which are output by the radio transmitter; and a gain control circuit coupled to the second amplifier stage and having a first feedback circuit for setting a first constant gain value and a second feedback circuit for setting a second constant gain value, wherein the gain control circuit responds to a binary signal generated by the processing means when the radio transmitter is indicated to be coupled to the second supply voltage by selecting between the first and second constant gains provided and applying the selected constant gain to the variable power RF signals output by the radio transmitter.

* * * * *